(12) United States Patent
Liao et al.

(10) Patent No.: US 9,437,565 B2
(45) Date of Patent: Sep. 6, 2016

(54) SEMICONDUCTOR SUBSTRATE AND SEMICONDUCTOR PACKAGE STRUCTURE HAVING THE SAME

(71) Applicant: ADVANCED SEMICONDUCTOR ENGINEERING, INC., Kaosiung (TW)

(72) Inventors: Guo-Cheng Liao, Kaohsiung (TW); Chia-Ching Chen, Kaohsiung (TW); Yi-Chuan Ding, Kaohsiung (TW)

(73) Assignee: ADVANCED SEMINCONDUCTOR ENGINEERING, INC., Koahsiung (TW)

( * ) Notice: Subject to any disclaimer, the term of this patent is extended or adjusted under 35 U.S.C. 154(b) by 0 days.

(21) Appl. No.: 14/586,735

(22) Filed: Dec. 30, 2014

(65) Prior Publication Data
US 2016/0190079 A1   Jun. 30, 2016

(51) Int. Cl.
*H01L 23/52* (2006.01)
*H01L 23/00* (2006.01)

(52) U.S. Cl.
CPC ....... *H01L 24/13* (2013.01); *H01L 2924/3841* (2013.01)

(58) Field of Classification Search
CPC ................ H01L 24/13; H01L 2924/3841
See application file for complete search history.

(56) References Cited

U.S. PATENT DOCUMENTS

| 6,002,172 | A  | * | 12/1999 | Desai ............. H01L 24/10 174/261 |
| 7,932,170 | B1 | * | 4/2011  | Huemoeller ...... H01L 21/4853 257/737 |
| 8,115,104 | B2 |   | 2/2012  | Liao |
| 8,390,116 | B1 |   | 3/2013  | Huemoeller et al. |
| 2009/0145645 | A1 | * | 6/2009 | Kwon ............. H01L 21/4853 174/260 |
| 2009/0146303 | A1 | * | 6/2009 | Kwon ............. H01L 23/49816 257/741 |
| 2009/0288861 | A1 |   | 11/2009 | Liao |
| 2011/0049703 | A1 | * | 3/2011 | Hsu ............... H01L 23/49811 257/737 |

FOREIGN PATENT DOCUMENTS

| CN | 101282622 B | 4/2011 |
| CN | 101290890 B | 7/2011 |

* cited by examiner

*Primary Examiner* — Shaun Campbell
(74) *Attorney, Agent, or Firm* — Foley & Lardner LLP; Cliff Z. Liu; Angela D. Murch

(57) ABSTRACT

The present disclosure relates to a semiconductor package structure including a semiconductor substrate, a semiconductor chip and a conductive material. The semiconductor substrate includes an insulating layer, a conductive circuit layer and a conductive bump. The conductive circuit layer is recessed from the top surface of the insulating layer, and includes at least one pad. The conductive bump is disposed on the at least one pad. A side surface of the conductive bump, a top surface of the at least one pad and a side surface of the insulating layer together define an accommodating space. The conductive material is electrically connected the conductive bump and the semiconductor chip, and a portion of the conductive material is disposed in the accommodating space.

18 Claims, 9 Drawing Sheets

SEMICONDUCTOR SUBSTRATE AND SEMICONDUCTOR PACKAGE STRUCTURE HAVING THE SAME

BACKGROUND

1. Technical Field

The present disclosure relates to a semiconductor substrate and a semiconductor package structure having the same. In particular, the present disclosure relates to a semiconductor substrate used for flip chip bonding/interconnection and a semiconductor package structure having the same.

2. Description of the Related Art

Along with the rapid development of electronic industries and the progress of semiconductor processing technologies, semiconductor chips are integrated with more electronic elements to achieve better electrical performance. Accordingly, the semiconductor chips are provided with more input/output (I/O) connections. To miniaturize semiconductor packages while using semiconductor chips with increasing numbers of I/O connections, the bonding pad density of the semiconductor substrates used for carrying the semiconductor chips should correspondingly increase.

However, the miniaturization of the semiconductor package also reduces the space on the semiconductor substrate around the semiconductor chip thus resulting in a further need for higher density of the bonding pads/solders.

Interconnection between the circuitry of the semiconductor chips and the circuitry of the semiconductor substrate may be made by way of bumps/solders which are attached to the bonding pads of the semiconductor chips, and are bonded to corresponding interconnect bumps/pillars on the bonding pads of the semiconductor substrate. However, for a flip chip package, it may be difficult to perform a bonding process between the semiconductor chip and the semiconductor substrate when bonding pad density is high. A short circuit can easily occur between adjacent conductive traces and the interconnect bumps/pillars of the semiconductor substrate, because solder may form a bridge and the product may thereby fail.

SUMMARY

An aspect of the present disclosure relates to a semiconductor package structure. In an embodiment, the semiconductor package structure comprises a semiconductor substrate, a semiconductor chip and a conductive material. The semiconductor substrate comprises an insulating layer, a conductive circuit layer and a conductive bump. The insulating layer has a top surface. The conductive circuit layer is recessed from the top surface of the insulating layer. The conductive circuit layer comprises at least one pad and a conductive trace connected to the at least one pad. The conductive bump is disposed on the at least one pad. A side surface of the conductive bump, a top surface of the at least one pad and a side surface of the insulating layer together define an accommodating space. The conductive material is electrically connected to the conductive bump and the semiconductor chip. A portion of the conductive material is disposed in the accommodating space.

Another aspect of the present disclosure relates to a semiconductor substrate. In an embodiment, the semiconductor substrate comprises an insulating layer, a conductive circuit layer and a first conductive bump. The insulating layer has a top surface. The conductive circuit layer is recessed from the top surface of the insulating layer. The conductive circuit layer comprises at least one first pad and a first conductive trace connected to the first pad. The first conductive bump is disposed on the first pad, wherein a width of the first conductive bump is less than a width of the first pad, and a side surface of the first conductive bump, a top surface of the first pad and a side surface of the insulating layer together define a first accommodating space.

Another aspect of the present disclosure relates to a semiconductor package structure. In an embodiment, the semiconductor package structure comprises a semiconductor substrate, a semiconductor chip and a conductive material. The semiconductor substrate comprises an insulating layer, a conductive circuit layer and a first conductive bump. The insulating layer has a top surface. The conductive circuit layer is recessed from the top surface of the insulating layer. The conductive circuit layer comprises at least one first pad and a first conductive trace connected to the first pad. The first conductive bump is disposed on the first pad. The conductive material is electrically connected to the first conductive bump and the semiconductor chip A portion of the conductive material is lower than the top surface of the insulating layer.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Figure 1:
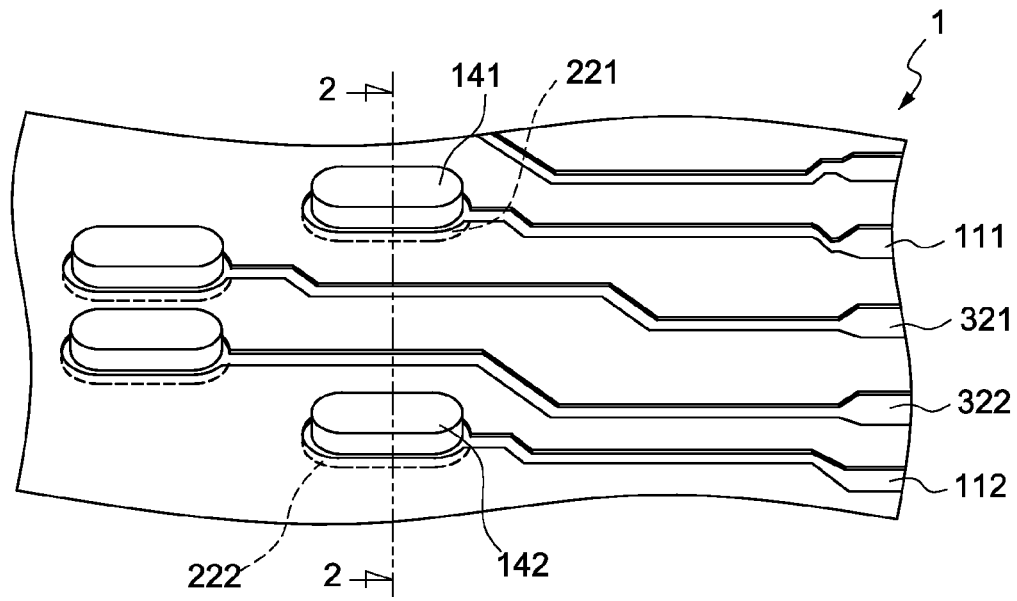
FIG. 1 is a perspective view of a semiconductor substrate according to an embodiment of the present disclosure.
Figure 2:
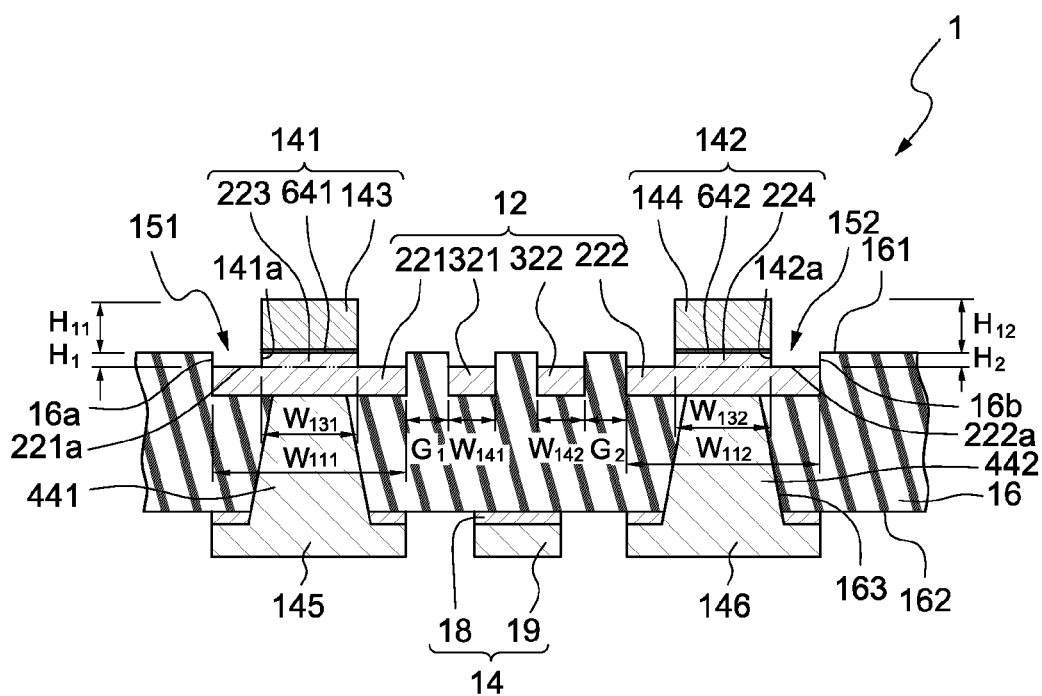
FIG. 2 is a cross-sectional view taken along line 2-2 of the semiconductor substrate in FIG. 1.

FIG. 1 shows a perspective view of a semiconductor substrate 1 according to an embodiment of the present disclosure. The semiconductor substrate 1 comprises a first conductive bump 141, a second conductive bump 142, a first pad 221, a second pad 222, a first conductive trace 111, a second conductive trace 112, a third conductive trace 321 and a fourth conductive trace 322. The first conductive bump 141 is disposed on the first pad 221 which is formed in an insulating layer 16 (FIG. 2), and the second conductive bump 142 is disposed on the second pad 222 which is formed in the insulating layer 16 (FIG. 2). The material of the first conductive bump 141 and the second conductive bump 142 may be the same as, or different than, the material of the first pad 221 and the second pad 222. Each of the first conductive bump 141, the second conductive bump 142, the first pad 221 and the second pad 222 includes copper, and may also include another metal or metal alloy or other conductive materials. As shown in FIG. 1, the shape of the first conductive bump 141 is substantially the same as that of the first pad 221, and the shape of the second conductive bump 142 is substantially the same as that of the second pad 222.

The first conductive trace 111 is connected to the first pad 221, and the second conductive trace 112 is connected to the second pad 222. In this embodiment, the third conductive trace 321 and the fourth conductive trace 322 are disposed between the first pad 221 and the second pad 222. In another embodiment, there may be only one conductive trace (either the third conductive trace 321 or the fourth conductive trace 322) disposed between the first pad 221 and the second pad 222.

FIG. 2 shows a cross-sectional view taken along line 2-2 of the semiconductor substrate 1 in FIG. 1. The semiconductor substrate 1 comprises an insulating layer 16, a first conductive circuit layer 12, the first conductive bump 141, the second conductive bump 142, a second conductive circuit layer 14, and a plurality of conductive vias (e.g., a first conductive via 441 and a second conductive via 442).

The material of the insulating layer 16 includes insulating material or dielectric material, such as polypropylene. The insulating layer 16 has a top surface 161, a bottom surface 162 and a plurality of through holes 163. The first conductive circuit layer 12 is disposed adjacent to the top surface 161 of the insulating layer 16, and is recessed from the top surface 161 of the insulating layer 16. The first conductive circuit layer 12 comprises the first pad 221, the third conductive trace 321, the second pad 222, the fourth conductive trace 322, the first conductive trace 111 (FIG. 1) and the second conductive trace 112 (FIG. 1). The first conductive circuit layer 12 is a patterned conductive circuit layer. The first conductive circuit layer 12 includes, for example, copper formed by an electroplating process, although other metals or metal alloys can be included.

In the embodiment of FIG. 2, the first conductive bump 141 comprises a main portion 143, a metal layer portion 641 and a protrusion portion 223. The protrusion portion 223 protrudes from the first pad 221, the metal layer portion 641 is disposed on the protrusion portion 223, and the main portion 143 is disposed on the metal layer portion 641. The widths of the main portion 143, the metal layer portion 641 and the protrusion portion 223 are substantially the same. In this embodiment, the protrusion portion 223 and the first pad 221 are formed integrally. That is, the protrusion portion 223 and the first pad 221 are formed at the same time after an etching process. The top surface of the protrusion portion 223 is substantially coplanar with the top surface 161 of the insulating layer 16, and is higher than the top surface 221a of the first pad 221. The metal layer portion 641 is formed, for example, by etching a copper foil. The main portion 143 is, for example, copper formed by an electroplating process, although other metals or metal alloys can be included.

The side surface 141a of the first conductive bump 141, the top surface 221a of the first pad 221 and the side surface 16a of the insulating layer 16 together define a first accommodating space 151. As such, when a conductive material (e.g., solder) disposed on the first conductive bump 141 is molten and overflows because of a reflow process or for other reasons, the first accommodating space 151 can provide a buffer and accommodate a portion of the overflowing conductive material. Therefore, the conductive material will not contact the adjacent third conductive trace 321 and cause a short circuit.

Also in the embodiment of FIG. 2, the second conductive bump 142 comprises a main portion 144, a metal layer portion 642 and a protrusion portion 224. The protrusion portion 224 protrudes from the second pad 222, the metal layer portion 642 is disposed on the protrusion portion 224, and the main portion 144 is disposed on the metal layer portion 642. The widths of the main portion 144, the metal layer portion 642 and the protrusion portion 224 are substantially the same. In this embodiment, the protrusion portion 224 and the second pad 222 are formed integrally. That is, the protrusion portion 224 and the second pad 222 are formed at the same time after an etching process. The top surface of the protrusion portion 224 is substantially coplanar with the top surface 161 of the insulating layer 16, and is higher than the top surface 222a of the second pad 222. The metal layer portion 642 is formed, for example, by etching a copper foil. The main portion 144 is, for example, copper formed by an electroplating process, although other metals or metal alloys can be included.

The side surface 142a of the second conductive bump 142, the top surface 222a of the second pad 222 and the side surface 16b of the insulating layer 16 together define a second accommodating space 152. As such, when a conductive material (e.g., solder) disposed on the second conductive bump 142 is molten and overflows because of a reflow process or for other reasons, the second accommodating space 152 can provide a buffer and accommodate a portion of the overflowing conductive material. Therefore, the conductive material will not contact the adjacent fourth conductive trace 322 and cause a short circuit.

The metal layer portion 641 and the metal layer portion 642 are part of a first metal layer.

The second conductive circuit layer 14 is located on the bottom surface 162 of the insulating layer 16. In the embodiment of FIG. 2, the second conductive circuit layer 14 is not embedded in the bottom surface 162 of the insulating layer 16. In this embodiment, the second conductive circuit layer 14 is a patterned conductive circuit layer, which includes, or alternatively consists of, a second metal layer 18 and a third metal layer 19. The second metal layer 18 is located on the bottom surface 162 of the insulating layer 16, and the third metal layer 19 is located on the second metal layer 18. The second metal layer 18 is formed, for example, by etching a copper foil. The third metal layer 19 is, for example, copper formed by an electroplating process, although other metals or metal alloys can be included. The second conductive circuit layer 14 includes a first solder ball pad 145 and a second solder ball pad 146.

The first conductive via 441 and the second conductive via 442 are located in the through holes 163, extend through the insulating layer 16, and are electrically connected to the first conductive circuit layer 12 and the second conductive circuit layer 14. In the embodiment of FIG. 2, the through holes 163 further extend across a portion of the second metal layer 18. The first conductive via 441 and the second conductive via 442 may be formed at the same time as the third metal layer 19.

In the embodiment of FIG. 2, a width $W_{131}$ of the first conductive bump 141 is less than a width $W_{111}$ of the first pad 221, and a width $W_{132}$ of the second conductive bump 142 is less than a width $W_{112}$ of the second pad 222. In this embodiment, the first conductive bump 141 is disposed fully on the top surface 221a of the first pad 221 and the second conductive bump 142 is disposed fully on the top surface 22a of the second pad 222. That is, the first conductive bump 141 and the second conductive bump 142 do not contact the top surface 161 of the insulating layer 16.

In the embodiment of FIG. 2, the width $W_{131}$ of the first conductive bump 141 is in a range from about 10 μm to about 40 μm, and the width $W_{111}$ of the first pad 221 is in a range from about 20 μm to about 50 μm. A ratio of the width $W_{131}$ of the first conductive bump 141 to the width $W_{111}$ of the first pad 221 is about 0.5 to about 0.8 to compensate for offset when the first conductive bump 141 is formed on the first pad 221. In this embodiment, a difference between the width $W_{131}$ of the first conductive bump 141 and the width $W_{111}$ of the first pad 221 is about 10 μm. In addition, the width $W_{132}$ of the second conductive bump 142 is in a range from about 10 μm to about 40 μm, and the width $W_{112}$ of the second pad 222 is in a range from about 20 μm to about 50 μm. A ratio of the width $W_{132}$ of the second conductive bump 142 to the width $W_{112}$ of the second pad 222 is about 0.5 to about 0.8 to compensate for offset when the second conductive bump 142 is formed on the second pad 222. In this embodiment, a difference between the width $W_{132}$ of the second conductive bump 142 and the width $W_{112}$ of the second pad 222 is approximately about 10 μm.

Further in the embodiment of FIG. 2, a gap $G_1$ between the third conductive trace 321 and the first pad 221 is in a range from about 5 μm to about 15 μm, and a gap $G_2$ between the fourth conductive trace 322 and the second pad 222 is in a range from about 5 μm to about 15 μm. In this embodiment, the width $W_{111}$ of the first pad 221 is greater than a width $W_{141}$ of the adjacent third conductive trace 321, and the width $W_{112}$ of the second pad 222 is greater than a width $W_{142}$ of the adjacent fourth conductive trace 322. In this embodiment, the range of the width $W_{141}$ of the third conductive trace 321 and the range of the width $W_{142}$ of the fourth conductive trace 322 are approximately the same, in a range from about 8 μm to about 14 μm.

In the embodiment of FIG. 2, a height $H_1$ is defined as the distance from the top surface 161 of the insulating layer 16 to the top surface 221a of the first pad 221, and a height $H_2$ is defined as the distance from the top surface 161 of the insulating layer 16 to the top surface 222a of the second pad 222. The height $H_1$ and the height $H_2$ are the depths of the first accommodating space 151 and the second accommodating space 152, respectively. The range of the height $H_1$ and the range of the height $H_2$ are approximately the same, in a range from about 5 μm to about 10 μm. A height $H_{11}$ is defined as the distance from a top surface of the first conductive bump 141 to the top surface 161 of the insulating layer 16, and a height $H_{12}$ is defined as the distance from a top surface of the second conductive bump 142 to the top surface 161 of the insulating layer 16. The range of the height $H_{11}$ and the height $H_{12}$ is approximately the same, in a range from about 10 μm to about 18 μm.

Figure 3:
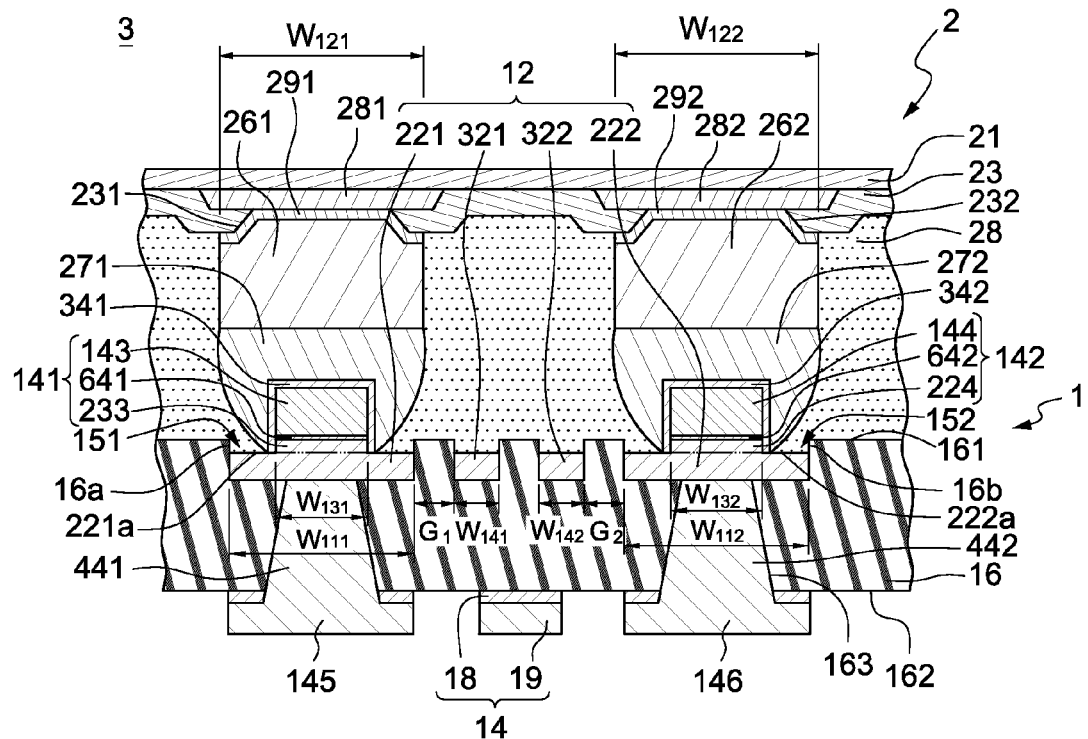
FIG. 3 is a partial cross-sectional view of a semiconductor package structure according to an embodiment of the present disclosure.

FIG. 3 shows a partial cross-sectional view of a semiconductor package structure 3 according to an embodiment of the present disclosure. The semiconductor package structure 3 comprises a semiconductor substrate 1, a semiconductor chip 2, a conductive material 271, 272, and a molding compound 28. The semiconductor substrate 1 of this embodiment is the same as the semiconductor substrate 1 of FIGS. 1 and 2.

The semiconductor chip 2 comprises a base substrate 21, a first I/O connection pad 281, a second I/O connection pad 282, a protection layer 23, a first Under Bump Metal (UBM) 291, a second UBM 292, a first pillar 261 and a second pillar 262. The first I/O connection pad 281, the second I/O connection pad 282 and the protection layer 23 are disposed on a surface of the base substrate 21. The protection layer 23 has a first opening 231 and a second opening 232 to expose the first I/O connection pad 281 and the second I/O connection pad 282, respectively. The first UBM 291 is disposed on the protection layer 23 and within the first opening 231 to contact the first I/O connection pad 281, and the second UBM 292 is disposed on the protection layer 23 and within the second opening 232 to contact the second I/O connection pad 282. The first pillar 261 is disposed on the first UBM 291, and the second pillar 261 is disposed on the second UBM 292.

The conductive material (e.g., solder) 271 is disposed between the first pillar 261 and the first conductive bump 141 so as to electrically connect the first conductive bump 141 and the semiconductor chip 2, and the conductive material (e.g., solder) 272 is disposed between the second pillar 262 and the second conductive bump 142 so as to electrically connect the second conductive bump 142 and the semiconductor chip 2. In the embodiment of FIG. 3, the conductive material 271, 272 flows along the side surface of the first conductive bump 141 and the second conductive bump 142, respectively, and enters the first accommodating space 151 and the second accommodating space 152, respectively, so that a part of the conductive material 271, 272 is lower than the top surface 161 of the insulating layer 16. That is, the conductive material 271, 272 is blocked from flowing across the top surface 161 of the insulation layer 16, so that the risk of short circuit caused by electrically connecting to the adjacent conductive trace will be reduced. In another embodiment, the amount of the conductive material 271 and the conductive material 272 is controlled precisely, so that the conductive material 271 is not bonded to the top surface 221a of the first pad 221, and the conductive material 272 is not bonded to the top surface 222a of the second pad 222. The molding compound 28 is disposed between the semiconductor substrate 1 and the semiconductor chip 2 so as to protect the first pillar 261 and the second pillar 262.

In the embodiment of FIG. 3, a ratio of the width $W_{111}$ of the first pad 221 to the width $W_{121}$ of the first UBM 291 is in a range from about 1 to about 0.9, and a ratio of the width $W_{112}$ of the second pad 222 to the width $W_{122}$ of the second UBM 292 is in a range from about 1 to about 0.9.

In the embodiment of FIG. 3, there is a first intermetallic compound (IMC) layer 341 formed between the first conductive bump 141 and the conductive material 271, and there is also a second IMC layer 342 formed between the second conductive bump 142 and the conductive material 272. In this embodiment, the material of the first IMC layer 341 and the second IMC layer 342 includes copper, and is preferably the copper tin alloy (e.g., $Cu_6Sn_5$).

Figure 4:
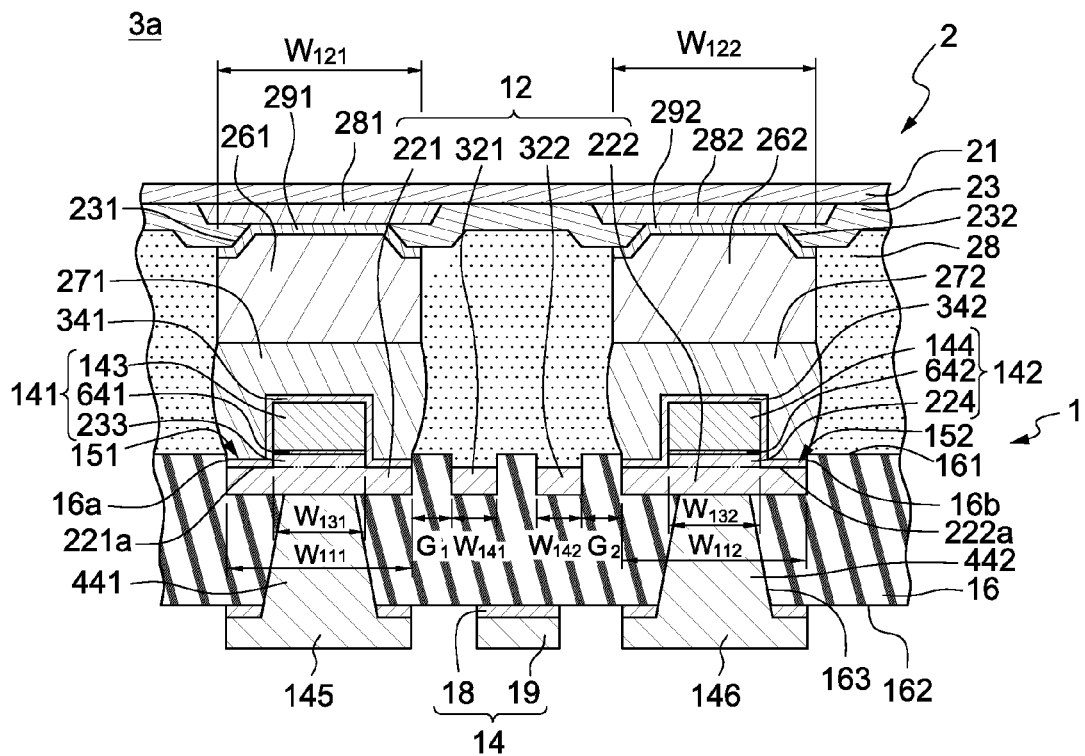
FIG. 4 is a partial cross-sectional view of a semiconductor package structure according to another embodiment of the present disclosure.

FIG. 4 shows a partial cross-sectional view of a semiconductor package 3a according to an embodiment of the present disclosure. The semiconductor package 3a is similar to the semiconductor package 3 illustrated in FIG. 3 except that more of the conductive material 271 is disposed in the first accommodating space 151 and more of the conductive material 272 is disposed in the second accommodating space 152 because of overflowing occurring during a solder reflow process. That is, an excess amount of a material of the conductive material 271, 272 is included, and the excess material of the conductive material 271, 272 will overflow into the first accommodating space 151 and the second accommodating space 152. However, the first accommodating space 151 and the second accommodating space 152 provide a buffer to accommodate the overflowing material, such that the conductive material 271, 272 will not contact an adjacent conductive trace (e.g., the third conductive trace 321 or the fourth conductive trace 322) and cause a short circuit. In addition, the conductive material 271 is bonded to the top surface 221a of the first pad 221, and thus an increased size of the first IMC layer 341 is formed between the first pad 221 and the conductive material 271. Similarly, the conductive material 272 is bonded to the top surface 222a of the second pad 222, and the second IMC layer 342 is formed between the second pad 222 and the conductive material 27. In theory, a larger area of the first IMC layer 341 formed between the conductive material 271 and the first pad 221 (or similarly a larger area of the second IMC layer 342 formed between the conductive material 272 and the second pad 222) improves the bonding strength. In another embodiment, a portion of the top surface 221a of the first pad 221 is bonded with the conductive material 271, and the other portion thereof is exposed, and a portion of the top surface 222a of the second pad 222 is bonded with the conductive material 272, and the other portion thereof is exposed: that is, the entirety of the top surface 221a is not covered by the conductive material 271 and the entirety of the top surface 222a is not covered by the conductive material 272.

Figure 5:
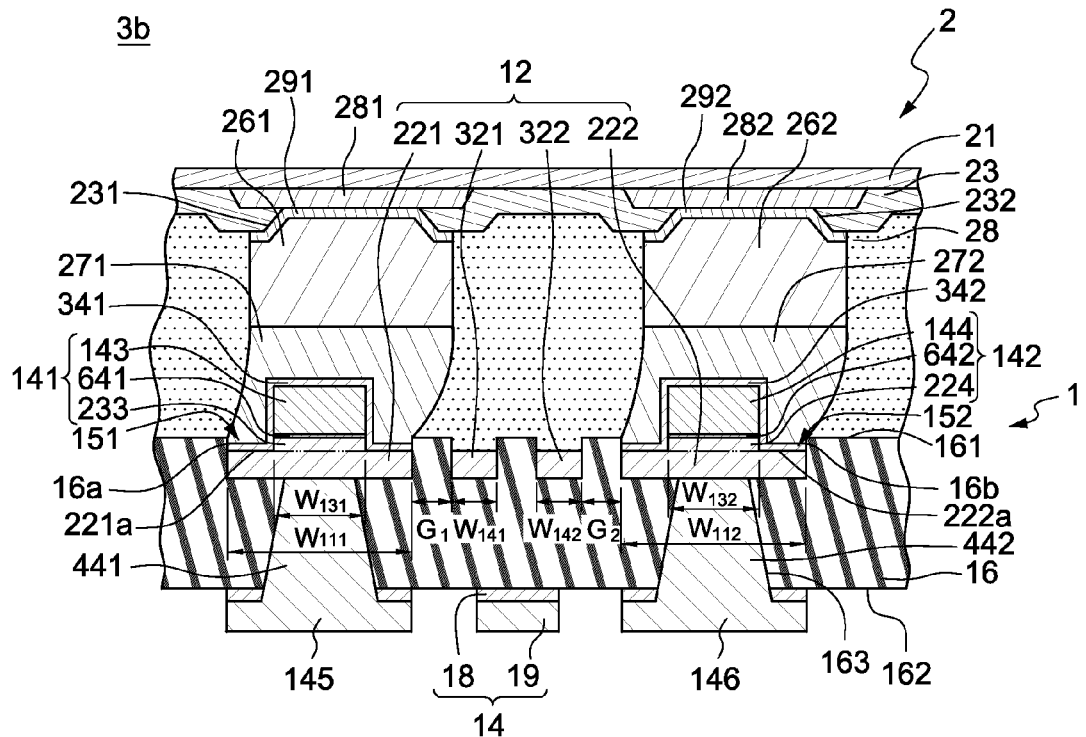
FIG. 5 is a partial cross-sectional view of a semiconductor package structure according to another embodiment of the present disclosure.

FIG. 5 shows a partial cross-sectional view of a semiconductor package structure 3b according to an embodiment of the present disclosure. The semiconductor package 3b is similar to the semiconductor package 3a illustrated in FIG. 4, except that the semiconductor chip 2 is shown shifted by an amount approximately equal to the width G1. In this embodiment, the side surface of the first UBM 291 is substantially coplanar with the side surface of the third conductive trace 321. This is due to the first and second conductive bumps 141, 142 guiding the conductive material 271, 272, respectively, to flow along the side surfaces of the first and second conductive bumps 141, 142, and the first and second accommodating spaces 151, 152 providing space for the flowing conductive material 271, 272, respectively, during a solder reflow process. Thus, even if the pads of the semiconductor chip 2 are not exactly aligned with the first and second conductive bumps 141, 142, the conductive material 271, 272 will not contact adjacent conductive trace (e.g., the third conductive trace 321 and the fourth conductive trace 322) and cause a short circuit.

Figure 6:
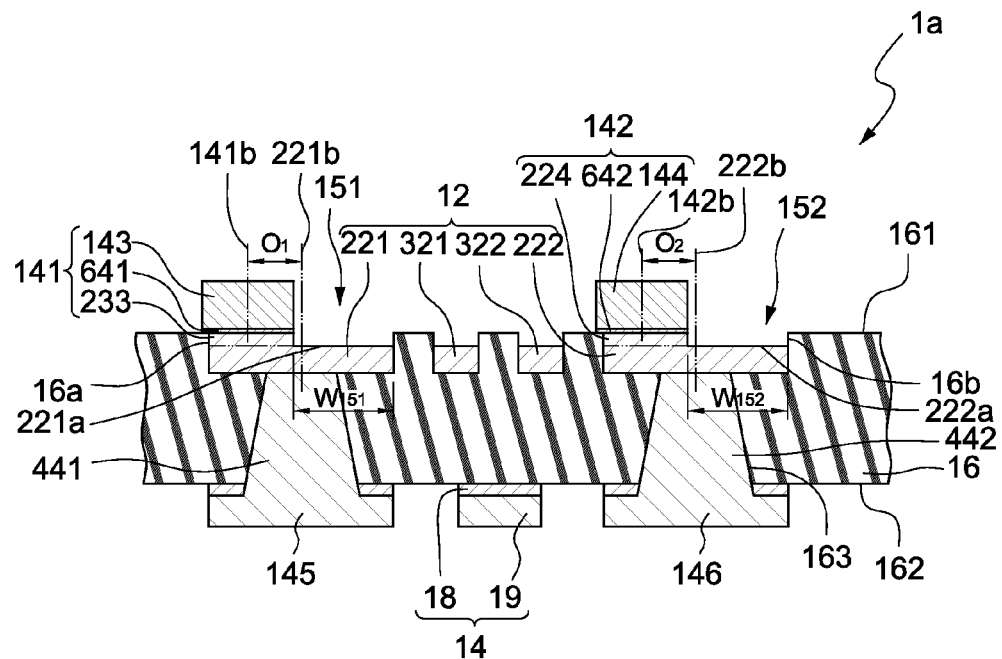
FIG. 6 is a cross-sectional view of a semiconductor substrate structure according to another embodiment of the present disclosure.

FIG. 6 is a cross-sectional view of a semiconductor substrate 1a according to another embodiment of the present disclosure. The semiconductor substrate 1a is similar to the semiconductor substrate 1 illustrated in FIG. 2 except that the first conductive bump 141 and the second conductive bump 142 are shifted. The first conductive bump 141 and the second conductive bump 142 cover a part of the top surface 161 of the insulating layer 16. In this embodiment, the metal layer portions 641, 642 cover a part of the top surface 161 of the insulating layer 16.

The first pad 221 has a geometrical central axis 221b, the first conductive bump 141 has a geometrical central axis 141b, and there is an offset $O_1$ between the geometrical central axis 221b of the first pad 221 and the geometrical central axis 141b of the first conductive bump 141. The second pad 222 has a geometrical central axis 222b, the second conductive bump 142 has a geometrical central axis 142b, and there is an offset $O_2$ between the geometrical central axis 222b of the second pad 222 and the geometrical central axis 142b of the second conductive bump 142. A width $W_{151}$ of the first accommodating space 151 is greater than the difference between the width $W_{131}$ of the first conductive bump 141 and the width $W_{111}$ of the first pad 221, and a width $W_{152}$ of the second accommodating space 152 is greater than the difference between the width $W_{132}$ of the second conductive bump 142 and the width $W_{112}$ of the second pad 222. That is, the widths of the first and second accommodating spaces 151, 152 are increased due to the offset of the first and second conductive bumps 141, 142.

Figure 7:
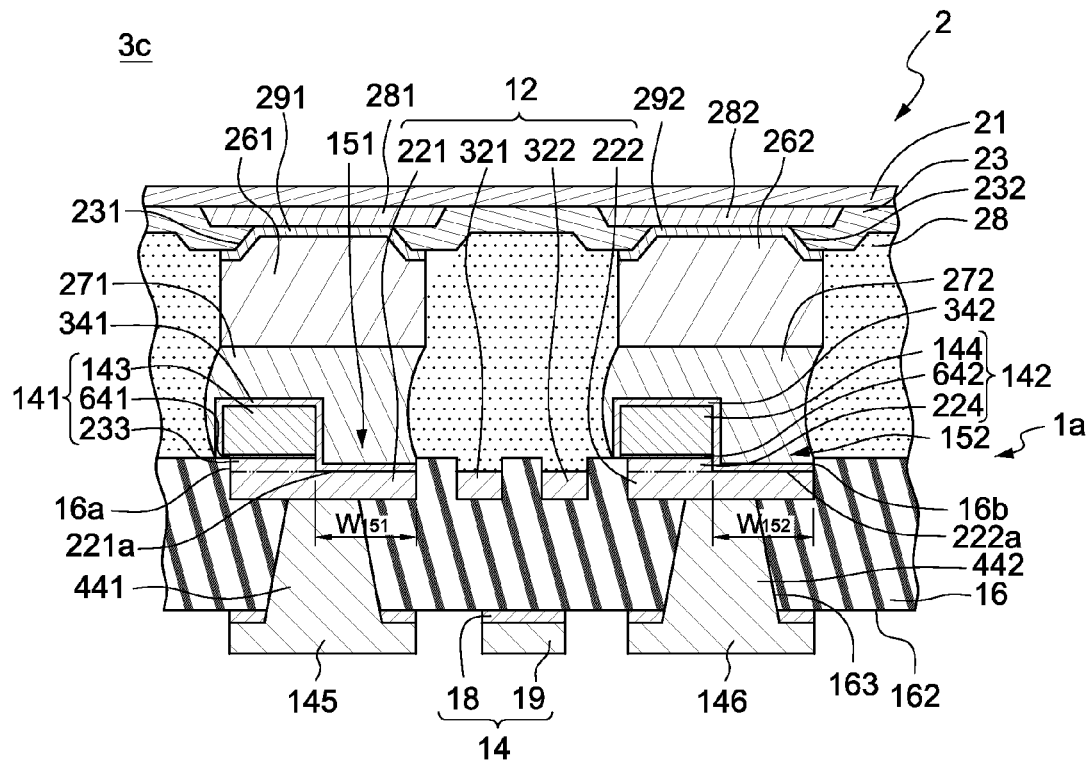
FIG. 7 is a partial cross-sectional view of a semiconductor package structure according to another embodiment of the present disclosure.

FIG. 7 is a partial cross-sectional view of a semiconductor package structure 3c according to another embodiment of the present disclosure. The semiconductor substrate 1a of the semiconductor package structure 3c is the same as the semiconductor substrate 1a illustrated in FIG. 6. The semiconductor structure 3c is similar to the semiconductor structure 3a illustrated in FIG. 4 except that the first conductive bump 141 and the second conductive bump 142 of the semiconductor substrate 1a are shifted, and therefore the first conductive bump 141 extends over part of the top surface 161 of the insulating layer 16, and the second conductive bump 142 extends over another part of the top surface 161 of the insulating layer 16. Correspondingly, the metal layer portions 641, 642 also extend over portions of the top surface 161 of the insulating layer 16. As stated above, the larger the widths of the first and second accommodating spaces 151, 152, the more conductive material 271, 272 will be kept within the first and second accommodating spaces 151, 152, respectively. Thus, the conductive material 271, 272 will not easily flow to the adjacent conductive trace and cause a short circuit even if the conductive bumps 141, 142 are offset and contact the top surface 161 of insulation layer 16. In an embodiment, the conductive material 271, 272 will not cover all of the first and second conductive bumps 141, 142, and portions of the side surfaces of the first and second conductive bumps 141, 142 are left exposed.

Figure 8:
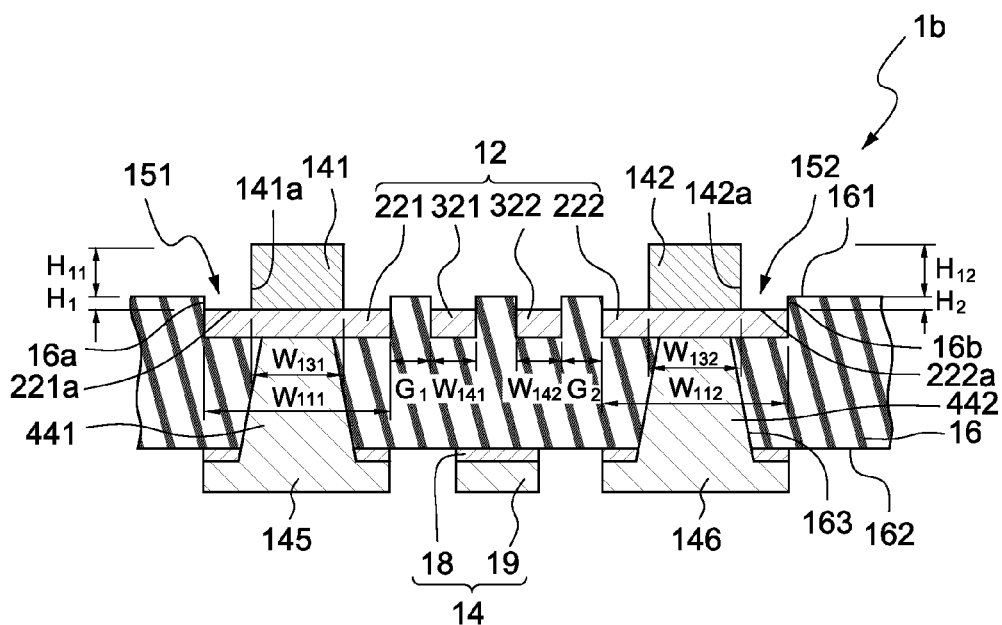
FIG. 8 is a cross-sectional view of a semiconductor substrate according to another embodiment of the present disclosure.

FIG. 8 is a cross-sectional view of a semiconductor substrate 1b according to another embodiment of the present disclosure. The semiconductor substrate 1b is similar to the semiconductor substrate 1 illustrated in FIG. 2 except that there are no metal layers 641, 642 or protrusion portions 223, 224 in the semiconductor substrate 1b. That is, the first conductive bump 141 is a single element which is disposed on the first pad 221 directly, and the second conductive bump 142 is a single element which is disposed on the second pad 222 directly.

Figure 9A:
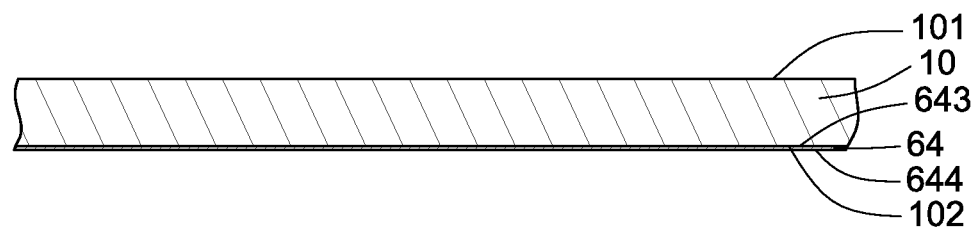
FIG. 9A, FIG. 9B, FIG. 9C, FIG. 9D, FIG. 9E, FIG. 9F, FIG. 9G, FIG. 9H, FIG. 9I and FIG. 9J illustrate a method for manufacturing a semiconductor package structure according to an embodiment of the present disclosure.

FIG. 9A, FIG. 9B, FIG. 9C, FIG. 9D, FIG. 9E, FIG. 9F, FIG. 9G, FIG. 9H, FIG. 9I and FIG. 9J are cross-sectional views of a semiconductor package during manufacturing, illustrating the method for manufacturing a semiconductor package according to an embodiment of the present disclosure. Referring to FIG. 9A, a carrier 10 is provided, and the carrier 10 has a first surface 101 and a second surface 102. Next, a first metal layer 64 is formed on the second surface 102 of the carrier 10. In this embodiment, the first metal layer 64 is a copper foil, which has a first surface 643 and a second surface 644. The first surface 643 of the first metal layer 64 is pressed on or adhered to the second surface 102 of the carrier 10.

Figure 9B:
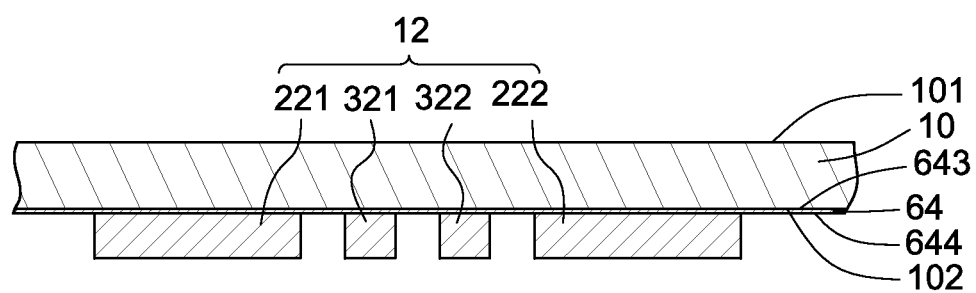

Referring to FIG. 9B, the first conductive circuit layer 12 is formed on the first metal layer 64. In this embodiment, the first conductive circuit layer 12 may be made from electroplated copper, which is formed on the second surface 644 of the first metal layer 64 by an electroplating process. The first conductive circuit layer 12 is a patterned conductive circuit layer, including the first pad 221, the third conductive trace 321, the second pad 222, the fourth conductive trace 322. In this embodiment, a distance between the first pad 221 and the second pad 222 is less than 25 µm.

Figure 9C:
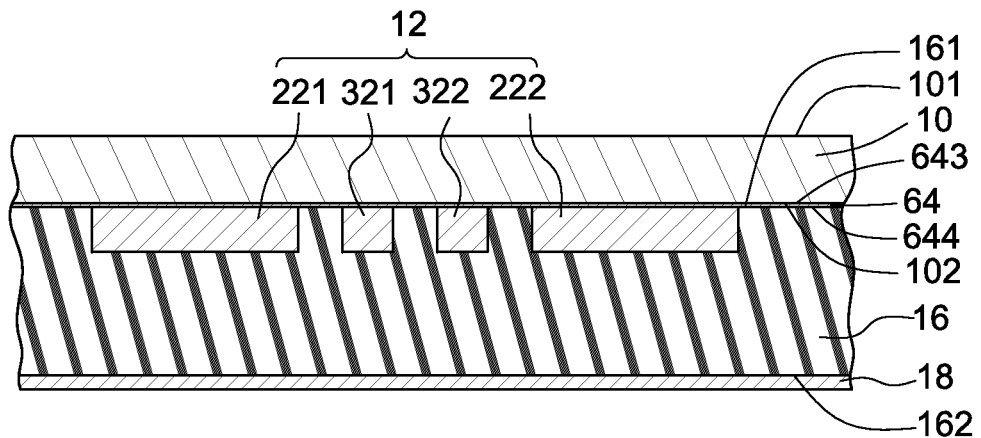

Referring to FIG. 9C, the insulating layer 16 is formed on the first conductive circuit layer 12 and the first metal layer 64. The insulating layer 16 is made from an insulating material or a dielectric material, for example, polypropylene, which is attached to the first conductive circuit layer 12 and the first metal layer 64 by using a pressing technology. After the pressing, the insulating layer 16 has a top surface 161 and a bottom surface 162, wherein the top surface 161 of the insulating layer 16 contacts the second surface 644 of the first metal layer 64, and the first conductive circuit layer 12 is embedded in the top surface 161 of the insulating layer 16. Next, a second metal layer 18 is formed on the bottom surface 162 of the insulating layer 16. The second metal layer 18 may be, for example, a copper foil, which is pressed on or adhered to the bottom surface 162 of the insulating layer 16.

Figure 9D:
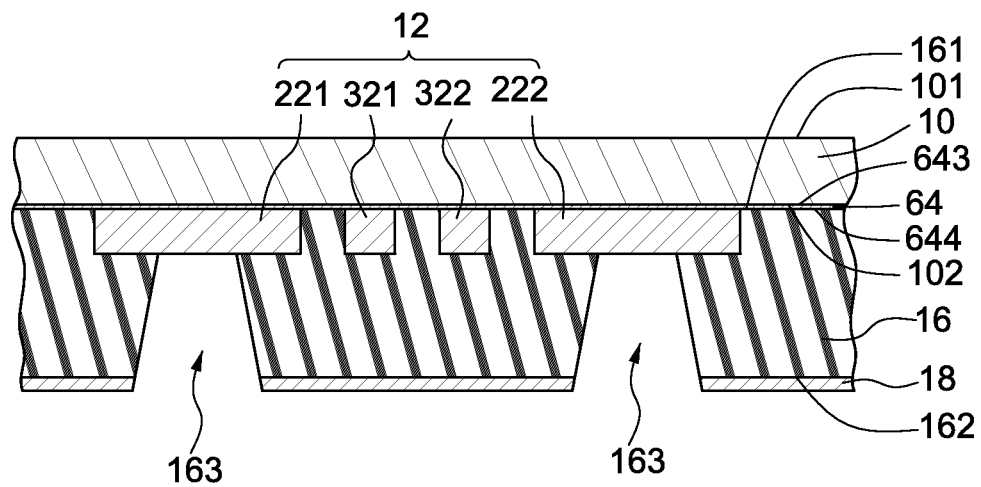

Referring to FIG. 9D, a plurality of through holes 163 are formed to extend through the second metal layer 18 and the insulating layer 16, so as to expose part of the first conductive circuit layer 12. For example, the through holes 163 are formed using laser drilling, and the first pad 221 and the second pad 222 are exposed.

Figure 9E:
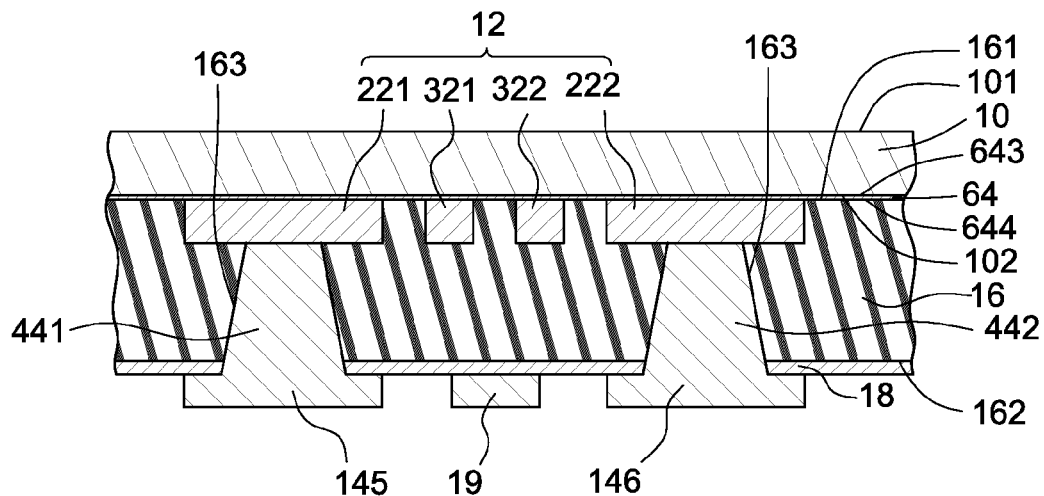

Referring to FIG. 9E, the through holes 163 are filled with a metal to form the first conductive via 441 and the second conductive via 442, and the third metal layer 19 (including the first solder ball pad 145 and the second solder ball pad 146) is formed as a patterned metal layer on the second metal layer 18, the first conductive via 441 and the second conductive via 442. The third metal layer 19, the first conductive via 441 and the second conductive via 442 may be formed during the same process step. Therefore, the first conductive via 441 and the second conductive via 442 extend through the insulating layer 16 and the second metal layer 18, and contact the first conductive circuit layer 12. The third metal layer 19 covers one part of the second metal layer 18 and exposes the other part of the second metal layer 18. In this embodiment, the third metal 19 may be electroplated copper, formed in a manner of electroplating.

Figure 9F:
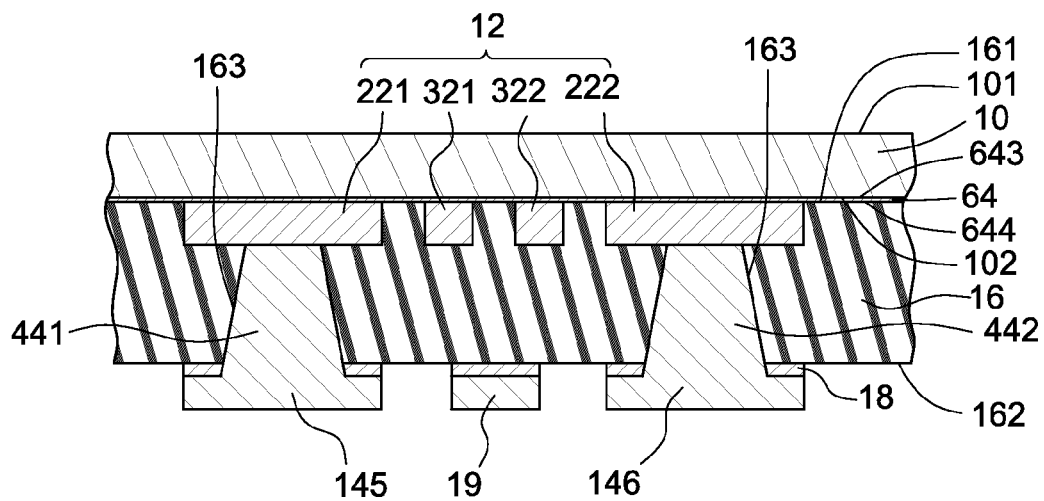

Referring to FIG. 9F, the second metal layer 18 not covered by the third metal layer 19 is removed, for example by etching, to form the second conductive circuit layer 14 (FIG. 2). The second conductive circuit layer 14 includes the first solder ball pad 145 and the second solder ball pad 146. In this embodiment, the second conductive circuit layer 14 is not embedded in the bottom surface 162 of the insulating layer 16.

Figure 9G:
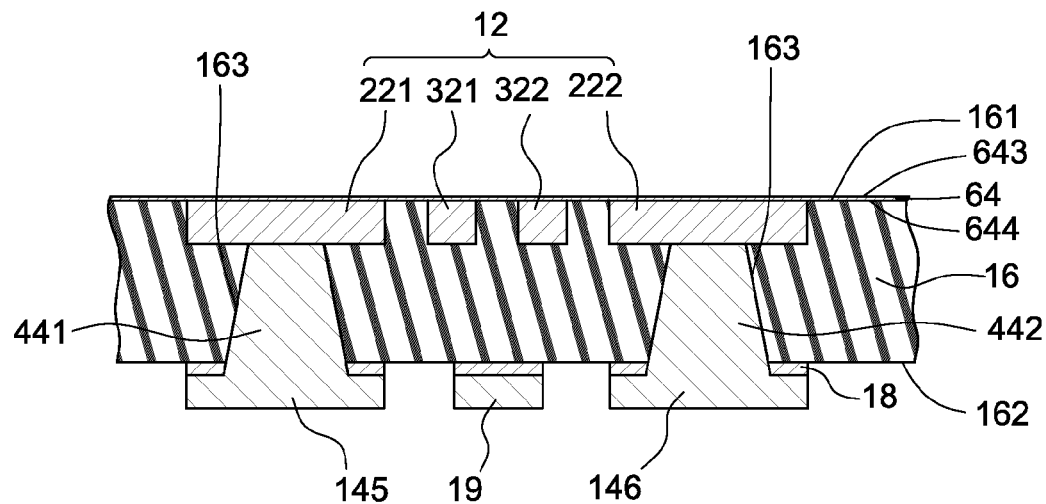

Referring to FIG. 9G, the carrier 10 is removed, for example by stripping, to expose the first metal layer 64. At this time, the first metal layer 64, the insulating layer 16, the first conductive circuit layer 12, the conductive vias 221, the second metal layer 18 and the third metal layer 19 form an embedded circuit substrate.

Figure 9H:
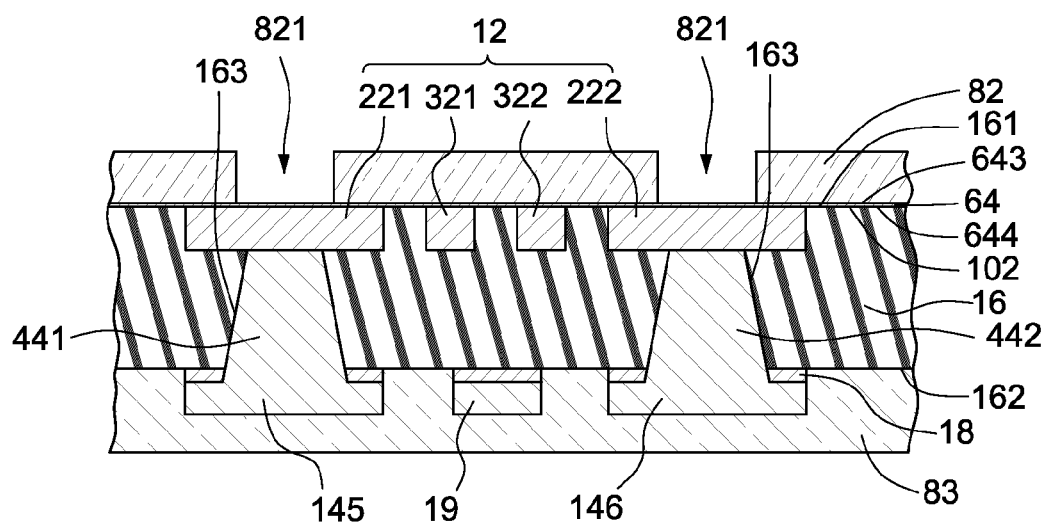

Referring to FIG. 9H, a first photoresist layer 82 is formed on the first metal layer 64, and a second photoresist layer 83 is formed on the third metal layer 19 and the bottom surface 162 of the insulating layer 16. In this embodiment, the first photoresist layer 82 may be a dry film. In this embodiment, the second photoresist layer 83 may be a dry film, does not have any opening, and completely covers the third metal layer 19 and the bottom surface 162 of the insulating layer 16. Next, a plurality of openings 821 are formed in the first photoresist layer 82 to expose part of the first metal layer 64. In this embodiment, the positions of the openings 821 correspond to the first pad 221 and the second pad 222, that is, the positions of the openings 821 do not correspond to the third conductive trace 321 and the fourth conductive trace 322.

Figure 9I:
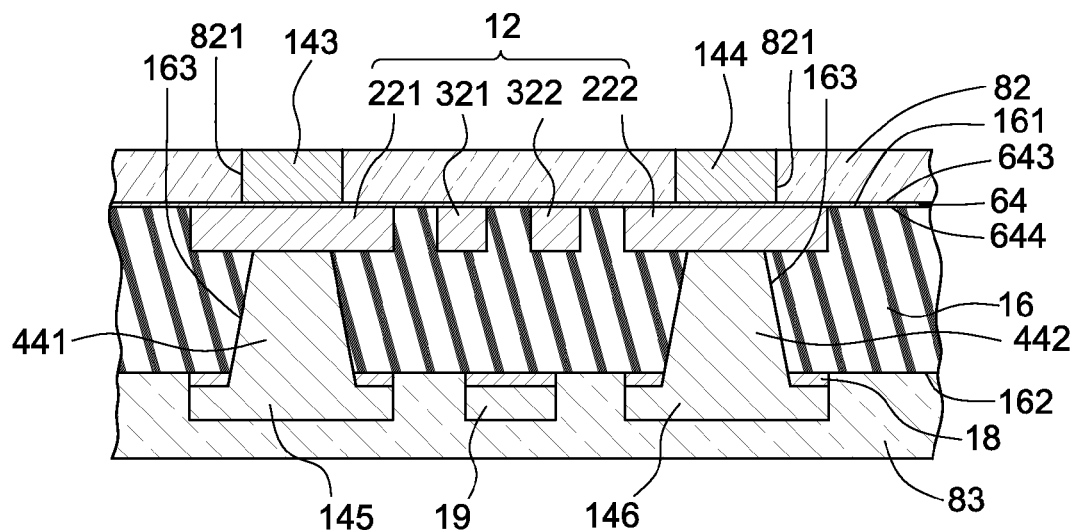

Referring to FIG. 9I, a plurality of main portions 143, 144 are directly formed on the first metal layer 64 in the openings 821. In this embodiment, the main portions 143, 144 may be made from electroplated copper, directly formed on the exposed first metal layer 64 in a manner of electroplating. In this embodiment, each of the main portions 143, 144 is positioned such that the main portions 143, 144 lie within lateral areas defined by the circumferences of the first pad 221 and the second pad 222, respectively. That is, the main portions 143, 144 are located right above the first pad 221 and the second pad 222, respectively. Further, the shapes (but not the surface areas) of the main portions 143, 144 are substantially the same as that of the first pad 221 and the second pad 222, respectively.

Figure 9J:
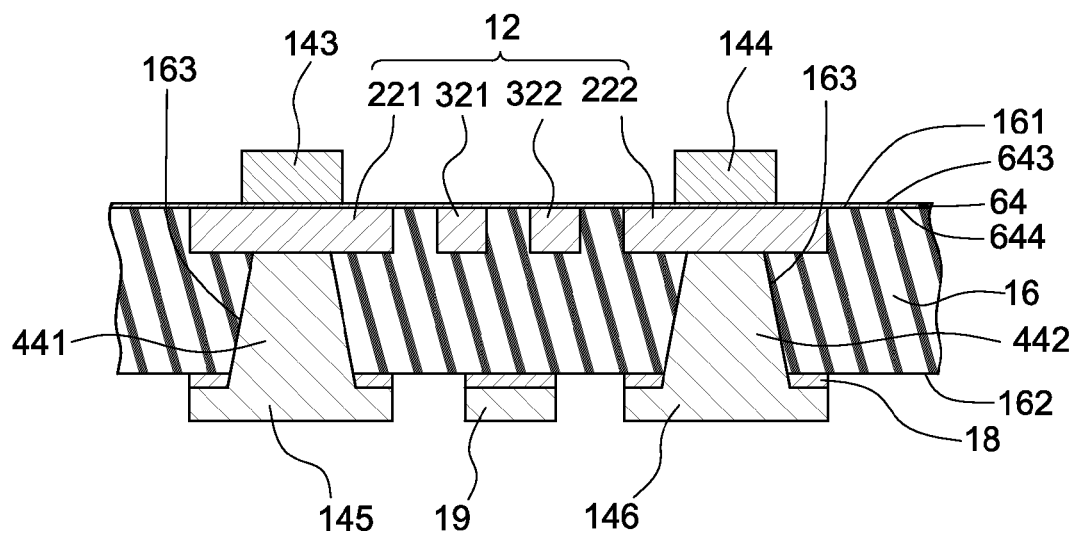

Referring to FIG. 9J, the first photoresist layer 82 and the second photoresist layer 83 are removed. Next, not shown in FIG. 9J, the exposed portion of the first metal layer 64 is removed, leaving metal layer portions 641 and 642. Additionally, the portions of the first pad 221 and the second pad 222 not respectively covered by the main portions 143, 144 are removed, for example by etching, to form the protrusion portions 223 and 224, the first accommodating space 151 and the second accommodating space 152 (FIG. 2). Now, the first conductive bump 141 comprises the main portion 143, the metal layer portion 641 and the protrusion portion 223; and the second conductive bump 142 comprises the main portion 144, the metal layer portion 642 and the protrusion portion 224. Thus, the semiconductor substrate 1 as shown in FIGS. 1 and 2 is obtained.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces can be deemed to be coplanar or substantially coplanar if a displacement between the two surfaces is no greater than 5 µm, no greater than 10 µm, or no greater than 15 µm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    a substrate comprising:
        an insulating layer having a top surface;
        a conductive circuit layer recessed from the top surface of the insulating layer, wherein the conductive circuit layer comprises at least one pad and a trace, and the trace is exposed from the insulating layer; and
        a conductive bump disposed on the at least one pad, wherein a side surface of the conductive bump, a top surface of the at least one pad and a side surface of the insulating layer together define an accommodating space;
    a semiconductor chip; and
    a conductive material electrically connecting the conductive bump and the semiconductor chip;
    wherein a portion of the conductive material is disposed in the accommodating space; and
    wherein the conductive bump comprises a main portion, a metal layer portion and a protrusion portion, the protrusion portion protrudes from the at least one pad, the metal layer portion is disposed on the protrusion portion, the main portion is disposed on the metal layer portion, and widths of the main portion, the metal layer portion and the protrusion portion are substantially the same.

2. The semiconductor package structure according to claim 1, wherein a ratio of a width of the conductive bump to a width of the at least one pad is in the range of 0.5 to 0.8.

3. The semiconductor package structure according to claim 1, wherein the trace is disposed adjacent to the at least one pad, the semiconductor chip comprises an Under Bump Metal (UBM), and a side surface of the UBM is substantially coplanar with a side surface of the trace.

4. The semiconductor package structure according to claim 1, wherein the conductive bump is disposed within the circumference of the at least one pad.

5. The semiconductor package structure according to claim 1, wherein the conductive bump covers a portion of the insulating layer.

6. The semiconductor package structure according to claim 1, wherein a width of the accommodating space is greater than the difference between a width of the conductive bump and a width of the at least one pad.

7. The semiconductor package structure according to claim 1, wherein a width of the conductive bump is less than a width of the at least one pad.

8. The semiconductor package structure according to claim 1, wherein the at least one pad has a geometrical central axis, the conductive bump has a geometrical central axis, and there is an offset between the geometrical central axis of the at least one pad and the geometrical central axis of the conductive bump.

9. The semiconductor package structure according to claim 1, wherein the protrusion portion and the at least one pad are formed integrally.

10. A semiconductor package structure, comprising:
    a substrate comprising:
        an insulating layer having a top surface;
        a conductive circuit layer recessed from the top surface of the insulating layer, wherein the conductive circuit layer comprises at least one first pad and a trace, and the trace is exposed from the insulating layer; and
        a first conductive bump disposed on the first pad;
    a semiconductor chip; and
    a conductive material electrically connected to the first conductive bump and the semiconductor chip;
    wherein a part of the conductive material is lower than the top surface of the insulating layer; and
    wherein the first conductive bump comprises a main portion, a metal layer portion and a protrusion portion, the protrusion portion protrudes from the first pad, the metal layer portion is disposed on the protrusion portion, the main portion is disposed on the metal layer portion, and the widths of the main portion, the metal layer portion and the protrusion portion are substantially the same.

11. The semiconductor package structure according to claim 10, wherein a width of the first conductive bump is less than a width of the first pad, and a side surface of the first conductive bump, a top surface of the first pad and a side surface of the insulating layer define a first accommodating space.

12. The semiconductor package structure according to claim 10, wherein a ratio of a width of the first conductive bump to a width of the first pad is in a range from 0.5 to 0.8.

13. The semiconductor package structure according to claim 10, wherein the substrate further comprises a second conductive bump, and the conductive circuit layer further comprises a second pad, wherein the second conductive bump is disposed on the second pad, a width of the second conductive bump is less than a width of the second pad, a side surface of the second conductive bump, a top surface of the second pad and a side surface of the insulating layer define a second accommodating space, and the trace is disposed between the first pad and the second pad.

14. The semiconductor package structure according to claim 10, wherein the first conductive bump is positioned within a circumference of the first pad.

15. The semiconductor package structure according to claim 10, wherein the first conductive bump covers a portion of the insulating layer.

16. The semiconductor package structure according to claim 10, wherein a width of the first conductive bump is less than a width of the first pad.

17. The semiconductor package structure according to claim 10, wherein the first pad has a geometrical central axis, the first conductive bump has a geometrical central axis, and there is an offset between the geometrical central axis of the first pad and the geometrical central axis of the first conductive bump.

18. The semiconductor package structure according to claim 10, wherein the protrusion portion and the first pad are formed integrally.

* * * * *